US011460511B2

(12) United States Patent
Kim et al.

(10) Patent No.: US 11,460,511 B2
(45) Date of Patent: Oct. 4, 2022

(54) BATTERY MANAGEMENT SYSTEM

(71) Applicant: SK INNOVATION CO., LTD., Seoul (KR)

(72) Inventors: Eun Young Kim, Daejeon (KR); Byung Eun Lee, Daejeon (KR); Ha Chul Jeong, Daejeon (KR); Young Lim Choi, Daejeon (KR)

(73) Assignee: SK INNOVATION CO., LTD., Seoul (KR)

( * ) Notice: Subject to any disclaimer, the term of this patent is extended or adjusted under 35 U.S.C. 154(b) by 292 days.

(21) Appl. No.: 16/279,707

(22) Filed: Feb. 19, 2019

(65) Prior Publication Data

US 2019/0257891 A1    Aug. 22, 2019

(30) Foreign Application Priority Data

Feb. 20, 2018  (KR) .......................... 10-2018-0019956

(51) Int. Cl.
  *G01R 31/392*  (2019.01)
  *G01R 31/36*  (2020.01)
  (Continued)

(52) U.S. Cl.
  CPC ....... *G01R 31/392* (2019.01); *G01R 31/3648* (2013.01); *G01R 31/374* (2019.01);
  (Continued)

(58) Field of Classification Search
  CPC .............. G01R 31/396; G01R 31/3842; G01R 31/382; G01R 31/374; G01R 31/3648;
  (Continued)

(56) References Cited

U.S. PATENT DOCUMENTS 8,571,738 B1   10/2013  Potter et al.
9,157,968 B1   10/2015  Taylor et al.
(Continued)

FOREIGN PATENT DOCUMENTS

CN    102231546 A    11/2011
CN    104009512 A    8/2014
(Continued)

OTHER PUBLICATIONS

Meng et al., English translation of CN 206619665, Nov. 2017. (Year: 2017).*

(Continued)

*Primary Examiner* — Michael P Nghiem
(74) *Attorney, Agent, or Firm* — IP & T Group LLP

(57) ABSTRACT

A battery management system is provided. According to an embodiment of the present disclosure, the battery management system for managing a battery pack including a plurality of battery modules may include a plurality of individual battery management units respectively corresponding to the plurality of battery modules and a management module configured to integrally manage the plurality of individual battery management units, wherein each of the individual battery management units includes a state-of-health (SOH) calculator to calculate SOH of each of the plurality of battery modules and a state-of-charge (SOC) calculator to calculate SOC of each of the plurality of battery modules, the management module manages a performance state of all of the plurality of battery modules on the basis of the SOH and SOC of each battery module and the SOC of each battery module is corrected by the SOH of each battery module.

9 Claims, 5 Drawing Sheets

(51) Int. Cl.
*G01R 31/3842* (2019.01)
*H01M 10/42* (2006.01)
*H01M 10/48* (2006.01)
*G01R 31/374* (2019.01)
*G01R 31/396* (2019.01)
*G01R 31/382* (2019.01)

(52) U.S. Cl.
CPC ....... *G01R 31/382* (2019.01); *G01R 31/3842* (2019.01); *G01R 31/396* (2019.01); *H01M 10/425* (2013.01); *H01M 10/482* (2013.01); *H01M 2010/4271* (2013.01); *H01M 2220/20* (2013.01)

(58) Field of Classification Search
CPC ............. H01M 10/425; H01M 10/482; H01M 2010/4271; H01M 2220/20
USPC .......................................................... 702/63
See application file for complete search history.

(56) References Cited

U.S. PATENT DOCUMENTS

| | | | |
|---|---|---|---|
| 2014/0242420 A1* | 8/2014 | Schaffner | H01M 10/48 429/9 |
| 2015/0002105 A1 | 1/2015 | Kelly | |
| 2015/0293183 A1 | 10/2015 | Tenmyo et al. | |
| 2015/0357852 A1 | 12/2015 | Nakao et al. | |
| 2015/0369873 A1 | 12/2015 | Nakao et al. | |
| 2016/0082859 A1 | 3/2016 | Yang et al. | |
| 2016/0084913 A1 | 3/2016 | Lupo et al. | |
| 2016/0226269 A1* | 8/2016 | Hwang | B60L 58/13 |
| 2016/0363632 A1* | 12/2016 | Park | G01R 31/396 |
| 2017/0244137 A1* | 8/2017 | Guo | G01R 31/382 |
| 2017/0276734 A1 | 9/2017 | Heiries et al. | |
| 2017/0363690 A1* | 12/2017 | Kawamura | G01R 31/382 |
| 2019/0067755 A1* | 2/2019 | Kim | H01M 10/425 |

FOREIGN PATENT DOCUMENTS

| | | | |
|---|---|---|---|
| CN | 104348205 A | | 2/2015 |
| CN | 105196877 A | | 12/2015 |
| CN | 105846489 A | | 8/2016 |
| CN | 106249152 A | | 12/2016 |
| CN | 206619665 | * | 11/2017 |
| EP | 2108972 | | 10/2009 |
| EP | 2772982 | | 9/2014 |
| EP | 3109656 | | 12/2016 |
| JP | 2014-197533 A | | 10/2014 |
| KR | 10-2012-0096278 | | 8/2012 |
| KR | 10-2012-0117470 | | 10/2012 |
| KR | 10-2012-0134004 | | 12/2012 |
| KR | 10-2012-0134415 A | | 12/2012 |
| KR | 20120134415 | * | 12/2012 |
| KR | 10-2013-0130949 | | 12/2013 |
| KR | 20140053619 | * | 5/2014 |
| KR | 10-2015-0128160 | | 11/2015 |
| KR | 10-2016-0080380 A | | 7/2016 |
| KR | 10-2016-0094229 A | | 8/2016 |
| KR | 10-2017-0085365 A | | 7/2017 |
| WO | 2017/178563 | | 10/2017 |

OTHER PUBLICATIONS

English translation of KR20140053619, May 2014. (Year: 2014).*
English translation of KR Office Action, submitted on Mar. 13, 2022. (Year: 2022).*
Extended European Search Report Issued by European Patent office dated Jul. 26, 2019.
Lu, L. et al., A review on the key issues for lithium-ion battery management in electric vehicles, Journal of Power Sources, vol. 226, Mar. 15, 2013, pp. 272-288, Elsevier.
Office Action issued by the Korean Intellectual Property Office dated Jan. 13, 2022.
Office Action issued by the Chinese Patent Office for Application No. 201910127118.3 dated Aug. 25, 2022.

* cited by examiner

BATTERY MANAGEMENT SYSTEM

CROSS-REFERENCE TO RELATED APPLICATION(S)

This application claims the benefit under 35 USC § 119(a) of Korean Patent Application No. 10-2018-0019956, filed on Feb. 20, 2018, in the Korean Intellectual Property Office, the entire disclosure of which is incorporated herein by reference for all purposes.

BACKGROUND

1. Field

The following description relates to a battery management system.

2. Description of Related Art

One of the biggest problems with vehicles using fossil fuels, such as gasoline and diesel, is that the use of fossil fuels causes air pollution. As a means for solving such a problem, techniques such as using a secondary battery capable of charging and discharging as a power source for a vehicle is drawing attention.

Therefore, an electric vehicle (EV) that can be fully battery-operated, a hybrid electric vehicle (HEV) that uses a combination of battery and an existing engine, and the like have been developed and commercialized. Nickel metal hydride (Ni-MH) batteries are mainly used as secondary batteries as power sources for EV, HEV, or the like. Recently, however, the use of lithium ion batteries has also been studied.

In order to use a secondary battery as a power source for an EV, HEV, and the like, the secondary battery is required to have high-output and large capacity. To this end, a plurality of small secondary batteries (unit batteries) are connected in series or in parallel to form a battery group (or module), and a plurality of battery groups are connected in series or in parallel to form a single battery pack for use as power source for an EV, HEV and the like.

A vehicle battery pack consisting of a number of modules may often have partial problems only in some of the modules, rather than problems of deterioration or performance degradation occurring at the same time in all modules. When performance problems occur in only some of the modules, it may be possible to reduce the cost and effort of replacing the vehicle battery if only the problematic modules could be replaced with new ones. Typically, a vehicle battery may include a battery management system (BMS) for monitoring the state of the battery. In the case where only some modules are replaced with new ones, information regarding the replaced modules and the previous modules needs to be reflected in an algorithm for generating information (e.g., state of charge (SOC), state of health (SOH), etc.) regarding battery management.

However, a conventional battery management system manages a voltage, open circuit voltage (OCV), SOC, SOH, and the like of the whole unit of the entire battery pack, and thus when only some modules in the battery pack are replaced, it is difficult for the entire management system to reflect such an event and it is not possible to monitor the state of each module.

RELATED ART DOCUMENT

Patent Document

Korean Laid-Open Patent Publication No. 10-2012-0117470 (Oct. 24, 2012)

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The disclosed embodiments are intended to provide a battery management system capable of monitoring a battery state of each individual battery module and thereby predicting a performance of the entire battery pack.

In one general aspect, there is provided a battery management system for managing a battery pack including a plurality of battery modules, the battery management system including a plurality of individual battery management units respectively corresponding to the plurality of battery modules and a management module configured to integrally manage the plurality of individual battery management units, wherein each of the individual battery management units includes a state-of-health (SOH) calculator configured to calculate SOH of each of the plurality of battery modules and a state-of-charge (SOC) calculator configured to calculate SOC of each of the plurality of battery modules, the management module is configured to manage a performance state of all of the plurality of battery modules on the basis of the SOH and SOC of each of the plurality of battery modules. Moreover, the SOC of each of the plurality of battery modules is corrected by the SOH of each of the plurality of battery modules.

The management module may set the usable capacity of each of the plurality of battery modules of the battery pack on the basis of the SOH and SOC of each of the plurality of battery modules.

The management module may manage the performance state of the entire of the plurality of battery modules on the basis of the minimum capacity among the usable capacities of the plurality of battery modules.

The SOH of each of the plurality of battery modules may be calculated through SOH for battery capacity ($SOH_C$) and an SOH for a battery resistance increase ($SOH_R$).

The SOH for battery capacity of each of the plurality of the battery modules may be calculated by the following equation:

$$SOH_C = \text{Capacity\_ini}\left(1 - \left(e^{a(1)+\frac{a(2)}{T}} \cdot t^{a(3)}\right)\right)$$

wherein $SOH_C$ denotes the SOH for the battery capacity, Capacity_ini denotes the initial battery capacity, t denotes the battery usage time (seconds), T denotes the battery temperature (K), and a(1), a(2), and a(3) denote relation constants.

The SOH for the battery resistance increase of each of the battery modules may be calculated by the following equation:

$$SOH_R = \text{IR\_ini}\left(1 - \left(e^{b(1)+\frac{b(2)}{T}} \cdot t^{a(3)}\right)\right)$$

wherein $SOH_R$ denotes the SOH the resistance increase, IR_ini denotes a product of a resistance R and a current I in an initial battery state, t denotes a battery usage time (seconds), T denotes the battery temperature (K), and b(1), b(2), and b(3) denote relation constants.

The SOC of each of the plurality of battery modules may be calculated by a battery circuit model.

The battery circuit model may be modeled according to the following equation:

$$V = OCV + I \cdot R_1 + \int \left(\frac{I}{C} - \frac{V_{RC}}{RC}\right) dt$$

wherein V denotes a battery voltage, OCV denotes an open circuit voltage, I denotes a current, $R_1$ denotes a resistance that varies as the battery deteriorates, C denotes a set capacitance, and R denotes a set resistance.

A value of the OCV may be corrected by an SOH value for the battery capacity that is calculated for each of the plurality of battery modules.

A value of the $I \cdot R_1$ product may be corrected by an SOH value for the resistance increase in a battery that is calculated for each of the plurality of battery modules.

The SOC of each of the plurality of battery modules may be calculated from an SOC-OCV table on the basis of the corrected OCV value.

A voltage and an output of each of the plurality of battery modules may be predicted from the battery circuit model.

Other features and aspects will become apparent from the following detailed description, the drawings, and the claims.

Figure 1:
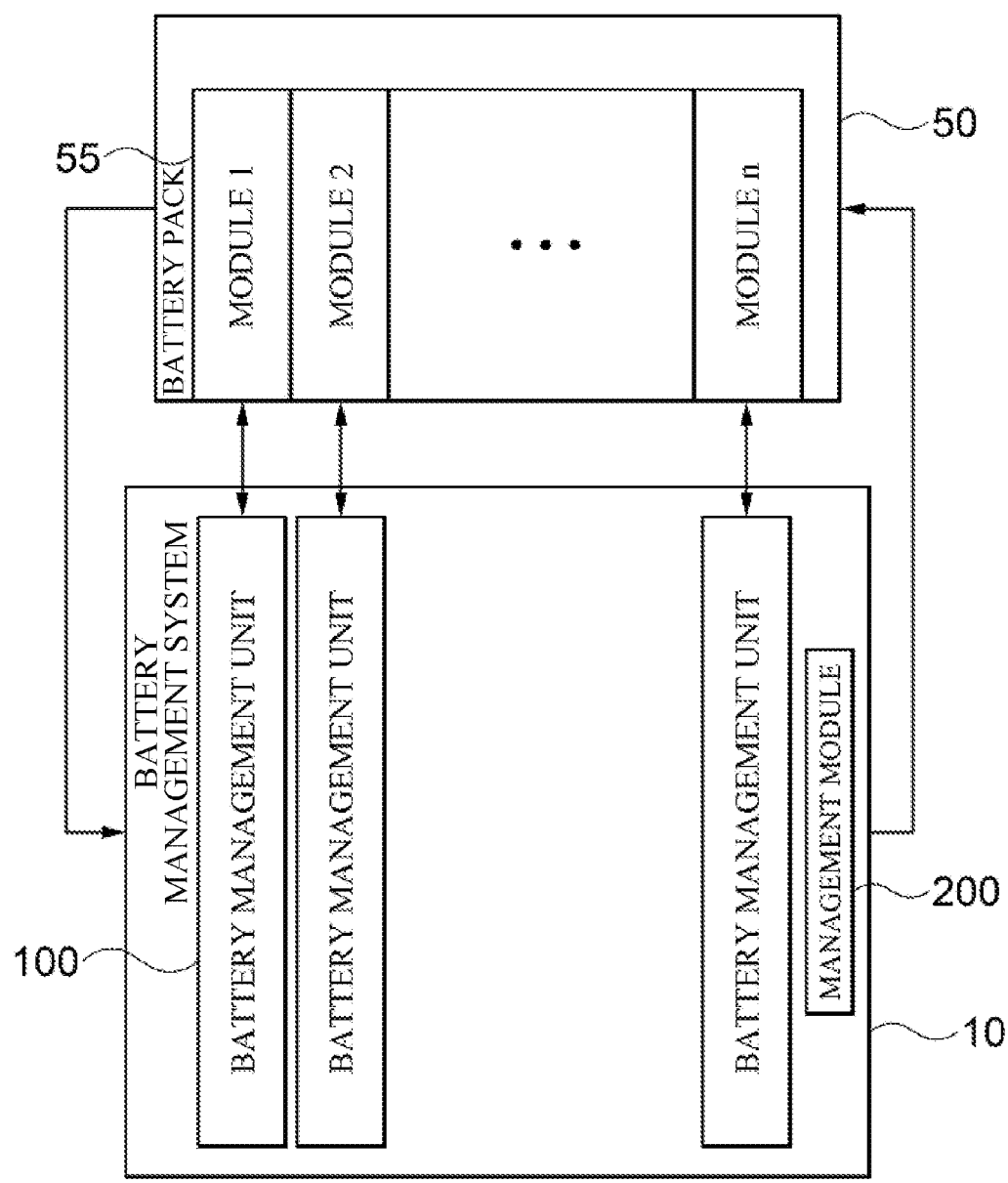
FIG. 1 is a diagram describing a plurality of battery modules and a battery management system according to an embodiment of the present disclosure.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art.

Descriptions of well-known functions and constructions may be omitted for increased clarity and conciseness. Also, terms described below are selected by considering functions in embodiments and meanings may vary depending on, for example, a user or operator's intentions or customs. Therefore, definitions of the terms should be made on the basis of the overall context. The terminology used in the detailed description is provided only to describe embodiments of the present disclosure and not for purposes of limitation. Unless the context clearly indicates otherwise, the singular forms include the plural forms, and vice versa. The articles 'a' and 'an' as used in this application and the appended claims should generally be construed to mean 'one or more' unless specified otherwise or clear from context to be directed to a singular form. It should be understood that the terms "comprises" or "includes" specify some features, numbers, steps, operations, elements, and/or combinations thereof when used herein, but do not preclude the presence in addition to the ones described or possibility of presence of one or more other features, numbers, steps, operations, elements, and/or combinations thereof.

FIG. 1 is a diagram describing a plurality of battery modules and a battery management system according to an embodiment of the present disclosure.

Referring to FIG. 1, a battery state of a battery pack 50 including a plurality of battery modules 55 (modules 1 to n) may be managed by a battery management system 10. The battery management system 10 may include individual battery management units 100 corresponding to the plurality of battery modules 55, respectively. Each of the individual battery management units 100 is configured to manage a battery state of a corresponding battery module 55. In addition, information about the individual battery modules 55 obtained by the individual battery management units 100 may be integrally managed by a management module 200 of the battery management system 10. By doing so, the battery state may be monitored for each battery module 55 and thereby the performance of the entire battery pack 50 may be predicted.

Figure 2:
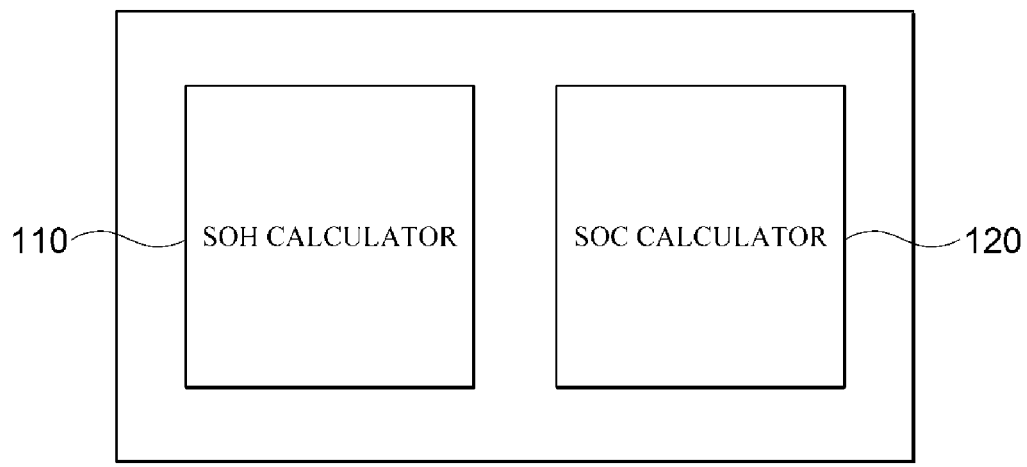
FIG. 2 is a diagram illustrating an individual battery management unit according to an embodiment of the present disclosure.

FIG. 2 is a diagram illustrating an individual battery management unit 100 according to an embodiment of the present disclosure.

Referring to FIG. 2, the individual battery management unit 100 may be configured to manage a battery state of a corresponding one of the individual battery modules 55 of the battery pack 50. The individual battery management unit 100 may include a state of health (SOH) calculator 110 configured to calculate the SOH of the corresponding one of the individual battery modules 55 and a state of charge (SOC) calculator 120 configured to calculate the SOC of the corresponding one of the individual battery modules 55. In this case, an SOC value may be corrected by an SOH value calculated by the SOH calculator 110, thereby making it possible to predict a more accurate SOC value.

Figure 3A:
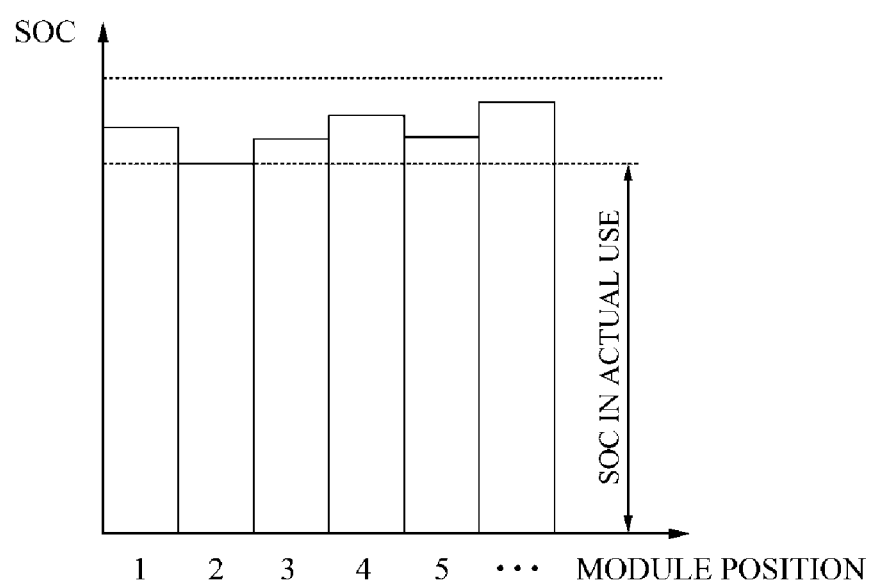
FIGS. 3A-3C are graphs describing a management method of a battery management system according to an embodiment of the present disclosure.
Figure 3B:
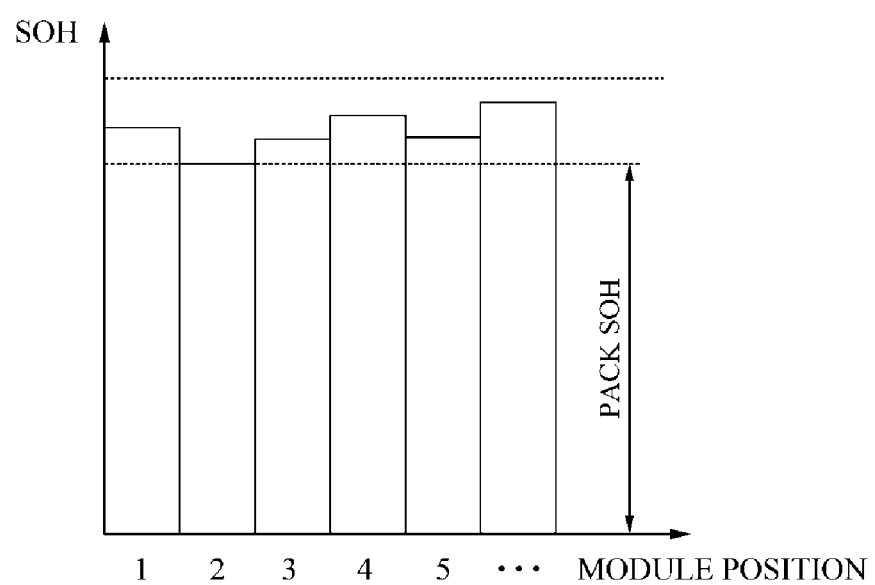
Figure 3C:
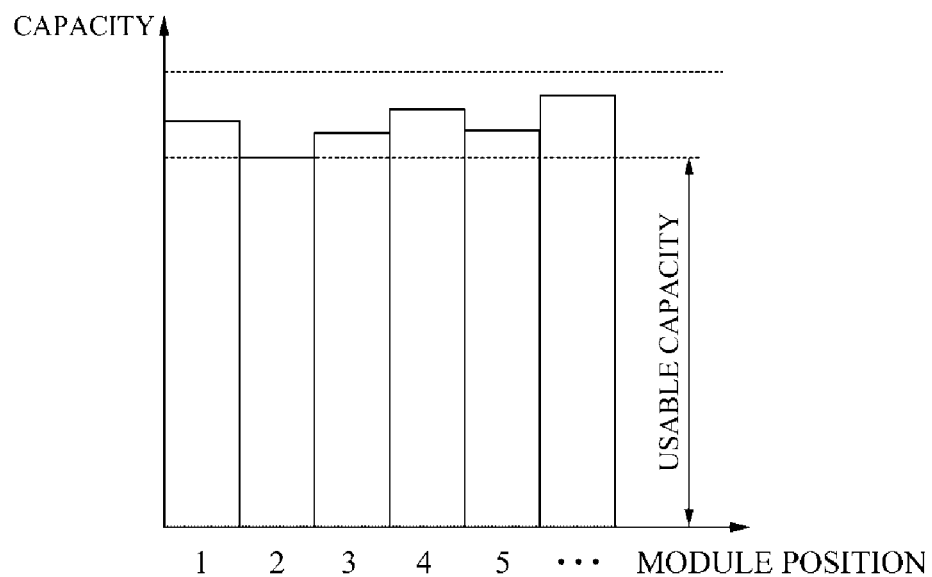

FIGS. 3A to 3C are graphs describing a management method of a battery management system according to an embodiment of the present disclosure.

The SOH and SOC of each of the individual battery modules 55 may be calculated by corresponding individual battery management units 100 of the battery management system 10. In addition, the capacity of the individual battery modules may be predicted based on the calculated SOH and SOC for each individual battery module. SOH, SOC, and capacity of each of the individual battery modules are shown in the form of graphs in FIGS. 3A to 3C. That is, FIG. 3A is a graph showing SOC of each individual battery module of the plurality of modules 55, FIG. 3B is a graph showing SOH of each individual battery module of the plurality of modules 55, and FIG. 3C is a graph showing capacity of each individual battery module of the plurality of modules 55.

Referring to FIGS. 3A to 3C, even though the individual battery modules of the plurality of modules 55 may have initially the same performance, their performances may differ from each other over time since the degree of performance deterioration of each individual battery module of the plurality of modules 55 may be different. The performance of the individual battery module of the plurality of modules 55 may lead to a difference in SOH, SOC, and capacity. In the present embodiment, not only the performance of the entire battery pack 50 is measured and predicted, but also the performance of each one of the individual battery modules 55 is measured and predicted so that it is possible to manage the entire battery pack 50 based on the individual battery module having the most deteriorated performance. Therefore, referring to FIGS. 3A to 3C, the performance state of the entire battery pack 50 may be maintained on the basis of the SOH, SOC, and capacity values of the individual battery module (second module in FIGS. 3A to 3C) that exhibits the most deteriorated performance.

Hereinafter, a method of calculating the SOH and SOC in an individual battery management unit 100 will be described.

The individual battery management unit 100 may measure the SOH on the basis of two parameters related to an individual battery module. The first is the SOH for the battery capacity and the second is the SOH for the battery resistance increase. As the battery deteriorates, the capacity of the battery decreases and the resistance in the battery increases. Thus, the SOH of the individual battery module may be calculated by calculating the degree of decrease of the capacity of the battery and the degree of the resistance increase in the battery.

In this case, an equation for calculating the SOH for the battery capacity may be shown as below.

$$SOH_C = \text{Capacity\_ini}\left(1 - \left(e^{a(1) + \frac{a(2)}{T}} \cdot t^{a(3)}\right)\right) \quad (1)$$

In the above equation, $SOH_C$ denotes SOH for the battery capacity, Capacity_ini denotes the initial battery capacity, t denotes the battery usage time (seconds), T denotes the battery temperature (K), and a(1), a(2), and a(3) denote relation constants.

That is, as the battery usage time elapses, the SOH value for the battery capacity may change. The change may also be a function of the temperature in the battery. The temperature may be measure at each individual module. When the SOH for the battery capacity of each individual battery module of the plurality of modules 55 is calculated, the individual battery module among the battery modules 55 with the most deterioration may be determined by collecting the calculated SOHs. In an embodiment, the entire battery pack 50 may be managed on the basis of the determined most deteriorated battery module among the plurality of the battery modules 55.

In addition, an equation for calculating the SOH for a resistance increase in a battery may be as below.

$$SOH_R = \text{IR\_ini}\left(1 - \left(e^{b(1) + \frac{b(2)}{T}} \cdot t^{b(3)}\right)\right) \quad (2)$$

In the above equation, $SOH_R$ denotes the SOH for a resistance increase, IR_ini denotes a product of a resistance R and a current I in an initial battery state, t denotes a battery usage time (seconds), T denotes the battery temperature (K), and b(1), b(2), and b(3) denote relation constants.

That is, as the battery usage time elapses, an SOH value for the resistance increase in the battery may change according to the temperature in the battery. When the SOH for the resistance increase of each of the individual battery modules 55 is calculated, the individual battery module with the most deterioration may be determined by collecting the calculated SOHs. In an embodiment, the entire battery pack 50 may thus be managed on the basis of the determined most deteriorated battery module among the battery modules 55.

The SOC of each individual battery module of the battery modules 55 may be calculated by a battery circuit model.

Figure 4:
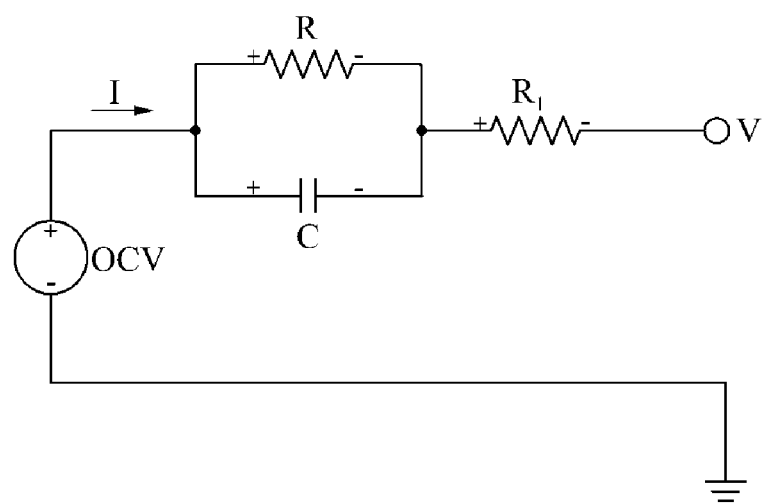
FIG. 4 is a circuit diagram illustrating a battery circuit model for obtaining a state of charge (SOC).

FIG. 4 is a circuit diagram illustrating a battery circuit model for obtaining the SOC of an individual battery module.

Referring to FIG. 4, a virtual battery circuit model including one capacitor and two resistors is assumed to represent a battery performance of each individual battery module of the battery modules 55, an open circuit voltage (OCV) of each individual battery module 55 may be obtained from the battery circuit model, and the SOC may be obtained through an SOC-OCV table.

The battery circuit model of FIG. 4 may be modeled according to the following equation.

$$V = OCV + I \cdot R_1 + \int \left(\frac{I}{C} - \frac{V_{RC}}{RC}\right) dt \quad (3)$$

In the above equation 3, V denotes a battery voltage, OCV denotes an open circuit voltage, I denotes a current, $R_1$ denotes a resistance that varies as a battery deteriorates, C denotes a set capacitance, and R denotes a set resistance.

In the above Equation 3, the symbols V, OCV, I, $R_1$, C, R are the same as those shown in the battery circuit model of FIG. 4.

The OCV of the individual battery module 55 may be obtained through Equation 3, and when the OCV is obtained, the SOC of the individual battery module 55 may be obtained through an SOC-OCV table. However, the OCV in Equation 3 may be corrected by the SOH ($SOH_C$) for the battery capacity that is calculated for the corresponding individual battery module and a value of $I \cdot R_1$ may be corrected by the SOH ($SOH_R$) for the resistance increase that is calculated for the corresponding individual battery module.

When an SOC algorithm is implemented for each individual battery module, a resistance value and a capacitance value may be calculated for each individual battery module. The resistance value and the capacitance value of each individual battery module are managed so that the SOC of the entire battery pack 50 to use may be set as the battery pack 50 is used. A method of setting the SOC to use may be based on a minimum SOC among the SOCs of the individual battery modules 55 as described above.

In addition, in Equation 3, not only the SOC, but also a voltage and an output of each individual battery module of the battery modules 55 may be predicted. Therefore, the performance of the entire battery pack 50 may be monitored by collecting information about the individual battery modules 55.

Figure 5:
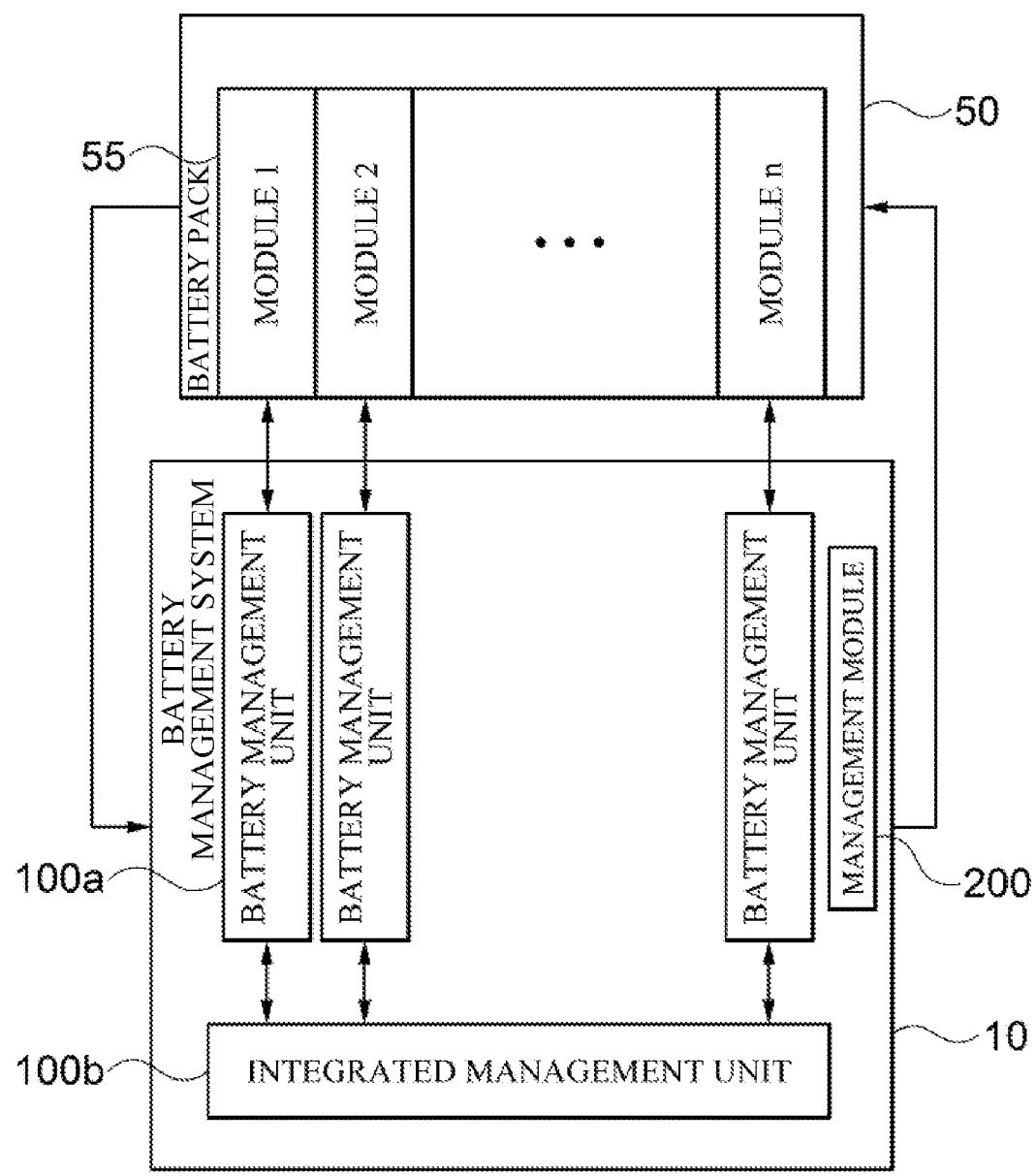
FIG. 5 is a diagram describing a plurality of battery modules and a battery management system according to another embodiment of the present disclosure.

FIG. 5 is a diagram for describing a plurality of battery modules and a battery management system according to another embodiment of the present disclosure.

When a battery circuit model is set to obtain the SOC and other factors of each one of the individual battery modules 55 as described in the above embodiment, the parameters of the resistance value and the capacitance value of each of the individual battery modules 55 are managed and, thus, the amount of data to be managed may increase. In another embodiment of the present disclosure, instead of managing the parameter values of each individual battery module, a difference between a resistance value and a capacitance value of each individual battery module may be represented by a relation constant. Only the relation constant of each individual battery module 55 may be calculated by a corresponding individual battery management unit 110a and a battery characteristic of each individual battery module 55 may be ultimately calculated by an integrated management unit 100b on the basis of the calculated relation constant, thereby facilitating the management of the entire battery pack 50.

According to various described embodiments of the present disclosure, it is possible to monitor a battery state of each individual battery module in battery pack, thereby predicting the performance of the entire battery pack.

In addition, according to various embodiments of the present disclosure, an SOC value of each individual battery module is corrected by an SOH value, thereby making it possible to predict a more accurate SOC value.

A number of examples have been described above. However, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A battery management system for managing a battery pack including a plurality of battery modules, the battery management system comprising:
a plurality of individual battery management units respectively corresponding to the plurality of battery modules; and
a management processor configured to integrally manage the plurality of individual battery management units,
wherein each of the individual battery management units includes:
a state-of-health (SOH) processor configured to calculate an SOH of each of the plurality of battery modules and a state-of-charge (SOC) processor configured to calculate an SOC of each of the plurality of battery modules;
wherein the management processor is configured to manage a performance state of the plurality of battery modules based on the SOH and SOC of each of the plurality of battery modules, and
the SOC of each of the plurality of battery modules is corrected by the SOH of each of the plurality of battery modules, and wherein the management processor is configured to determine a most deteriorated battery module among the plurality of battery modules, and manage the performance state of the plurality of battery modules based on the determined most deteriorated battery module,
wherein the SOC of each of the plurality of battery modules is calculated based on a battery circuit model,
wherein the battery circuit model is represented by one capacitor and two resistors,
wherein the SOC processor is configured to calculate an open circuit voltage of each of the plurality of battery modules using the following equation:

$$V = OCV + I \cdot R_1 + \int \left( \frac{I}{C} - \frac{V_{RC}}{RC} \right) dt$$

wherein V denotes a battery voltage, OCV denotes the open circuit voltage, I denotes a current, $R_1$ denotes a resistance that varies as a battery deteriorates, C denotes a set capacitance, and R denotes a set resistance.

2. The battery management system of claim 1, wherein the management processor is configured to set usable capacity of each of the plurality of battery modules based on the SOH and SOC of each of the plurality of battery modules.

3. The battery management system of claim 1, wherein the SOH of each of the plurality of battery modules is calculated through SOH for battery capacity and SOH for a resistance increase in a battery.

4. The battery management system of claim 1, wherein a value of the OCV is corrected by an SOH value for battery capacity that is calculated for each of the plurality of battery modules.

5. The battery management system of claim 4, wherein the SOC of each of the plurality of battery modules is calculated from an SOC-OCV table based on the corrected OCV value.

6. The battery management system of claim 1, wherein a value of $I \cdot R_1$ is corrected by an SOH value for a resistance increase in a battery that is calculated for each of the plurality of battery modules.

7. The battery management system of claim 1, wherein a voltage and an output of each of the plurality of battery modules are predicted from the battery circuit model.

8. A battery management system for managing a battery pack including a plurality of battery modules, the battery management system comprising:
a plurality of individual battery management units respectively corresponding to the plurality of battery modules; and
a management processor configured to integrally manage the plurality of individual battery management units,
wherein each of the individual battery management units includes:
a state-of-health (SOH) processor configured to calculate an SOH of each of the plurality of battery modules and a state-of-charge (SOC) processor configured to calculate an SOC of each of the plurality of battery modules;
wherein the management processor is configured to manage a performance state of the plurality of battery modules based on the SOH and SOC of each of the plurality of battery modules, and
the SOC of each of the plurality of battery modules is corrected by the SOH of each of the plurality of battery modules, wherein the SOH of each of the plurality of battery modules is calculated through SOH for battery capacity, wherein the SOH for battery capacity is calculated by the following equation:

$$SOH_C = \text{Capacity\_ini}\left(1 - \left(e^{a(1)+\frac{a(2)}{T}} \cdot t^{a(3)}\right)\right)$$

wherein $SOH_C$ denotes SOH for the battery capacity, Capacity_ini denotes the initial battery capacity, t denotes the battery usage time (seconds), T denotes the battery temperature (K), and a(1), a(2), and a(3) denote relation constants.

9. A battery management system for managing a battery pack including a plurality of battery modules, the battery management system comprising:
 a plurality of individual battery management units respectively corresponding to the plurality of battery modules; and
 a management processor configured to integrally manage the plurality of individual battery management units,
 wherein each of the individual battery management units includes:
 a state-of-health (SOH) processor configured to calculate an SOH of each of the plurality of battery modules and
 a state-of-charge (SOC) processor configured to calculate an SOC of each of the plurality of battery modules;
 wherein the management processor is configured to manage a performance state of the plurality of battery modules based on the SOH and SOC of each of the plurality of battery modules, and
 the SOC of each of the plurality of battery modules is corrected by the SOH of each of the plurality of battery modules,
 wherein the SOH of each of the plurality of battery modules is calculated through SOH for a resistance increase in a battery,
 wherein the SOH for a resistance increase in a battery is calculated by the following equation:

$$SOH_R = \text{IR\_ini}\left(1 - \left(e^{b(1)+\frac{b(2)}{T}} \cdot t^{b(3)}\right)\right)$$

wherein $SOH_R$ denotes the SOH for a resistance increase, IR_ini denotes a product of a resistance and a current in an initial battery state, t denotes a battery usage time (seconds), T denotes the battery temperature (K), and b(1), b(2), and b(3) denote relation constants.

* * * * *